(12) United States Patent
Lee et al.

(10) Patent No.: US 12,525,561 B2
(45) Date of Patent: Jan. 13, 2026

(54) SEMICONDUCTOR DEVICE AND METHOD OF FORMING DUMMY SOP WITHIN SAW STREET

(71) Applicant: STATS ChipPAC Pte. Ltd., Singapore (SG)

(72) Inventors: KyuWon Lee, Gyeonggi-do (KR); JiWon Jang, Seoul (KR); Myeongjin Kim, Incheon (KR); HyeSun Kim, Incheon (KR); YoungDeuk Lee, Seoul (KR); YoungJin Woo, Gyeonggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 386 days.

(21) Appl. No.: 18/459,196

(22) Filed: Aug. 31, 2023

(65) Prior Publication Data
US 2025/0079372 A1 Mar. 6, 2025

(51) Int. Cl.
*H01L 23/00* (2006.01)

(52) U.S. Cl.
CPC .............. *H01L 24/14* (2013.01); *H01L 24/97* (2013.01); *H01L 2224/14131* (2013.01); *H01L 2224/14515* (2013.01); *H01L 2224/97* (2013.01)

(58) Field of Classification Search
CPC ................................. H01L 24/97; H01L 24/14
See application file for complete search history.

(56) References Cited

U.S. PATENT DOCUMENTS

| | | | |
|---|---|---|---|
| 7,061,117 B2 | 6/2006 | Yang et al. | |
| 8,574,960 B2 * | 11/2013 | Pagaila | H01L 25/00 257/E23.129 |
| 9,343,429 B2 * | 5/2016 | Pagaila | H01L 21/561 |
| 10,504,751 B2 * | 12/2019 | Chen | H01L 21/78 |
| 10,665,534 B2 * | 5/2020 | Lee | H01L 23/49816 |
| 11,682,646 B2 | 6/2023 | Nayini et al. | |
| 2014/0264905 A1 * | 9/2014 | Lee | H01L 25/0657 257/774 |
| 2015/0001709 A1 * | 1/2015 | Bao | H01L 24/96 257/737 |
| 2021/0066239 A1 * | 3/2021 | Moreno | H01L 21/561 |
| 2023/0253271 A1 * | 8/2023 | Blin | H01L 22/34 257/48 |

* cited by examiner

*Primary Examiner* — Steven M Page
(74) *Attorney, Agent, or Firm* — Robert D. Atkins; PATENT LAW GROUP: Atkins and Associates, P.C.

(57) ABSTRACT

A semiconductor device has a semiconductor wafer or substrate including a plurality of semiconductor die. A plurality of first bumps is formed over an active surface of the semiconductor wafer. A plurality of second bumps is formed within a saw street of the semiconductor wafer separating the plurality of semiconductor die. A top surface of the first bumps is coplanar with a top surface of the second bumps. The second bumps are formed within a first saw street of the semiconductor wafer and further within a second saw street of the semiconductor wafer different from the first saw street. The first bumps are electrically connected to the semiconductor die to provide a function for the semiconductor die. The second bumps are dummy bumps that have no electrical function for the semiconductor die. The semiconductor wafer is singulated through the saw street and second bumps.

25 Claims, 13 Drawing Sheets

SEMICONDUCTOR DEVICE AND METHOD OF FORMING DUMMY SOP WITHIN SAW STREET

FIELD OF THE INVENTION

The present invention relates in general to semiconductor devices and, more particularly, to a semiconductor device and method of forming a dummy SOP within a strip saw street or line.

BACKGROUND OF THE INVENTION

Semiconductor devices are commonly found in modern electrical products. Semiconductor devices perform a wide range of functions, such as signal processing, high-speed calculations, transmitting and receiving electromagnetic signals, controlling electrical devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices often contain a semiconductor die or substrate with electrical interconnect structures, e.g., redistribution layers (RDL) formed over one or more surfaces of the semiconductor die or substrate to perform necessary electrical functions. A plurality of bumps is formed on the surface of the semiconductor die or substrate for external interconnect.

It is desirable to provide maximum or at least sufficient adhesion between the bumps and surface pads connecting to the RDL. Toward that end, the bumps can be further flattened by a coining process. Coining is a form of precision stamping in which the bump is subjected to sufficient high stress under the stamping pressure to induce plastic flow on the surface of the bump in order to create a flat top surface. The plastic flow also reduces surface grain size, and the work hardens the material, while the deeper material retains properties of toughness and ductility.

The coining process introduces considerable pressure and stress on the bumps and semiconductor wafer. For smaller semiconductor die, e.g., 4.0 millimeters (mm) by 4.0 mm, containing say, nineteen bumps per die, and 1049 die per wafer, that yields 19,931 bumps to absorb the coining pressure upon the wafer. In some manufacturing processes, the coining pressure is too great or becomes uneven for the 19,931 supporting bumps, leading to bump dissimilarities and lack of control of bump diameter, height, and coplanarity. Forming additional bumps on an active surface of the semiconductor wafer, for the sole purpose of addressing coining pressure, is undesirable from a design and manufacturing perspective.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
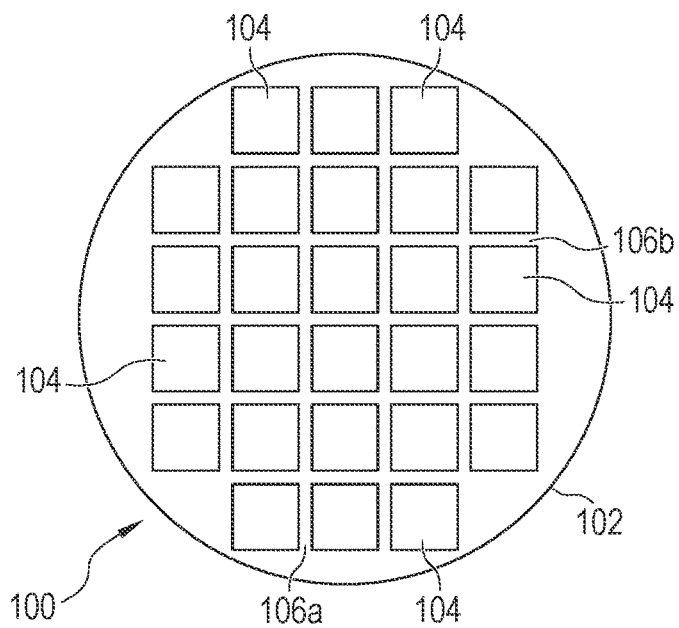
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street or line 106. Saw street 106 provides cutting areas to singulate semiconductor wafer 100 into individual semiconductor die 104. Saw street 106a extends in a first direction across semiconductor wafer 100, and saw street 106b extends in a second direction across semiconductor wafer 100 different from saw street 106a. In one embodiment, semiconductor wafer 100 has a width or diameter of 100-450 mm.

Figure 1B:
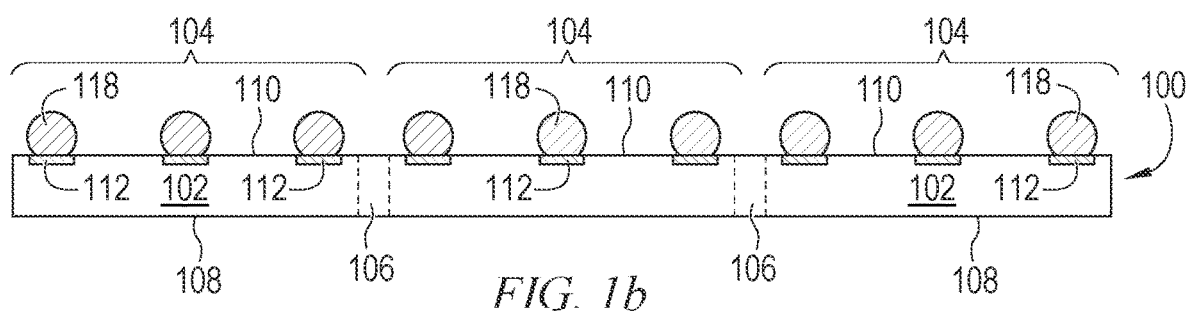

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 118. In one embodiment, bump 118 is formed over an under bump metallization (UBM) having a wetting layer, barrier layer, and adhesive layer. Bump 118 can also be compression bonded or thermocompression bonded to conductive layer 112. In one embodiment, bump 118 is a solder-on-pad (SOP) interconnect structure. Bump 118 represents one type of interconnect structure that can be formed over conductive layer 112. The interconnect structure can also use bond wires, conductive paste, stud bump, micro bump, or other electrical interconnect.

It is desirable to provide maximum or at least sufficient adhesion between bumps 118 and conductive layer 112. Toward that end, bumps 118 can be further flattened by a coining process. Coining is a form of precision stamping in which bump 118 is subjected to sufficient high stress under the stamping pressure to induce plastic flow on the surface of the bump in order to create a flat top surface. The plastic flow also reduces surface grain size, and the work hardens the material, while the deeper material retains properties of toughness and ductility.

Figure 1C:
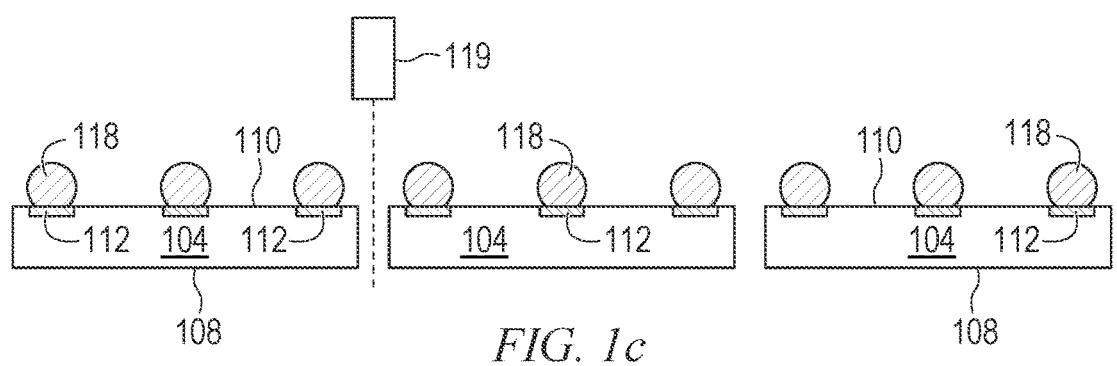

In FIG. 1c, semiconductor wafer 100 is singulated through saw street 106 using a saw blade or laser cutting tool 119 into individual semiconductor die 104. The individual semiconductor die 104 can be inspected and electrically tested for identification of known good die or known good unit (KGD/KGU) post singulation.

Figure 2A:
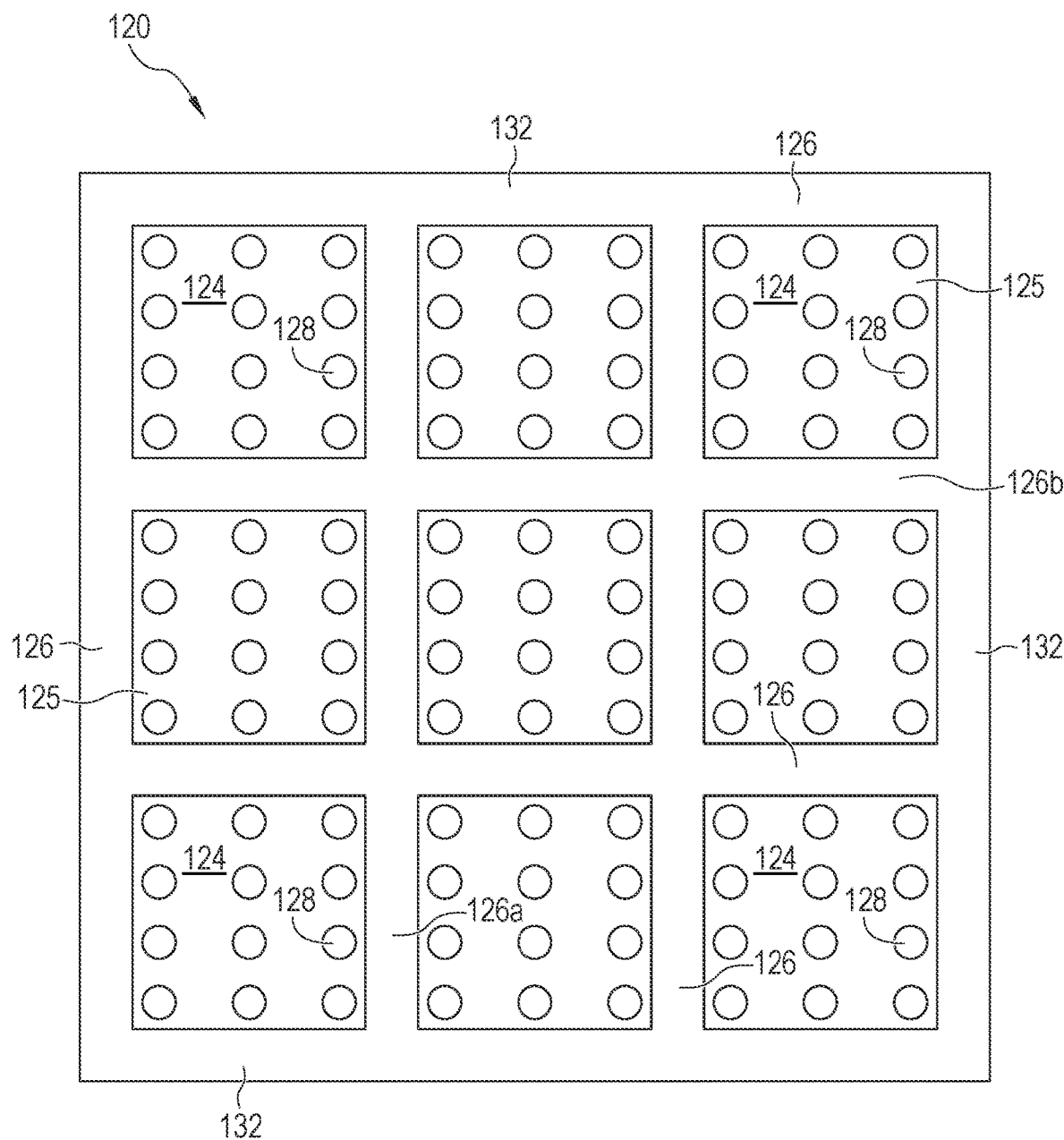
FIGS. 2a-2j illustrate a process of forming dummy bumps within saw streets of a semiconductor wafer to distribute coining pressure.

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk material for structural support. A plurality of semiconductor die or electrical components 124 is formed on wafer 120 separated by a non-active, inter-die wafer area or saw street 126, similar to FIGS. 1a-1b. Saw street 126 provides cutting areas to singulate semiconductor wafer 120 into individual semiconductor die 124. Saw street 126a extends in a first direction across semiconductor wafer 120, and saw street 126b extends in a second direction across semiconductor wafer 120 different from saw street 126a. In this case, semiconductor wafer or strip 120 is rectangular in shape with a width of 240.0 mm and a length of 74.0-95.0 mm.

Each semiconductor die 124 has a back or non-active surface and active surface 125 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 125 to implement analog circuits or digital circuits, such as DSP, ASIC, memory, or other signal processing circuit. Semiconductor die 124 may also contain IPDs, such as inductors, capacitors, and resistors, for RF signal processing.

Figure 2B:
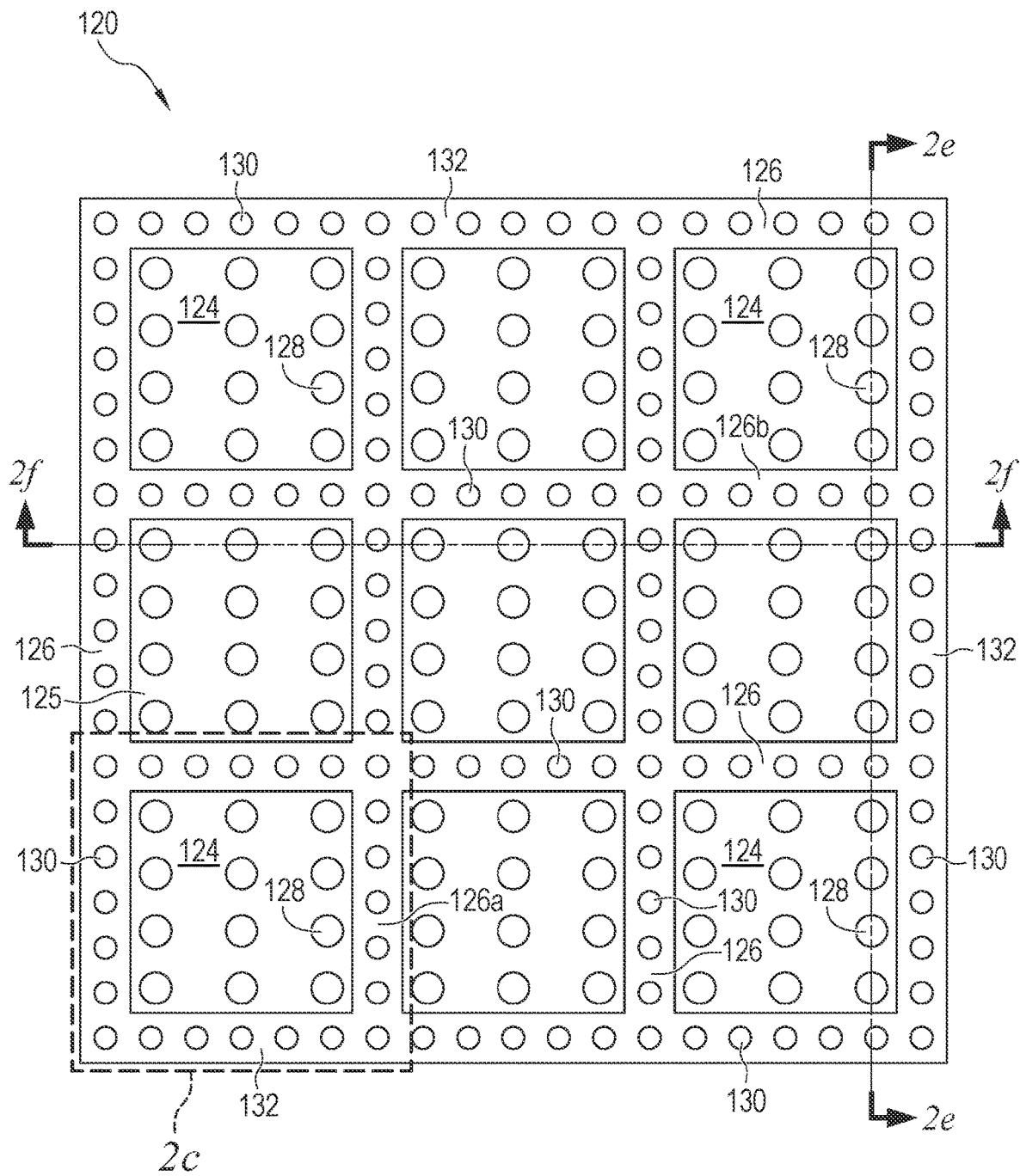
Figure 2C:
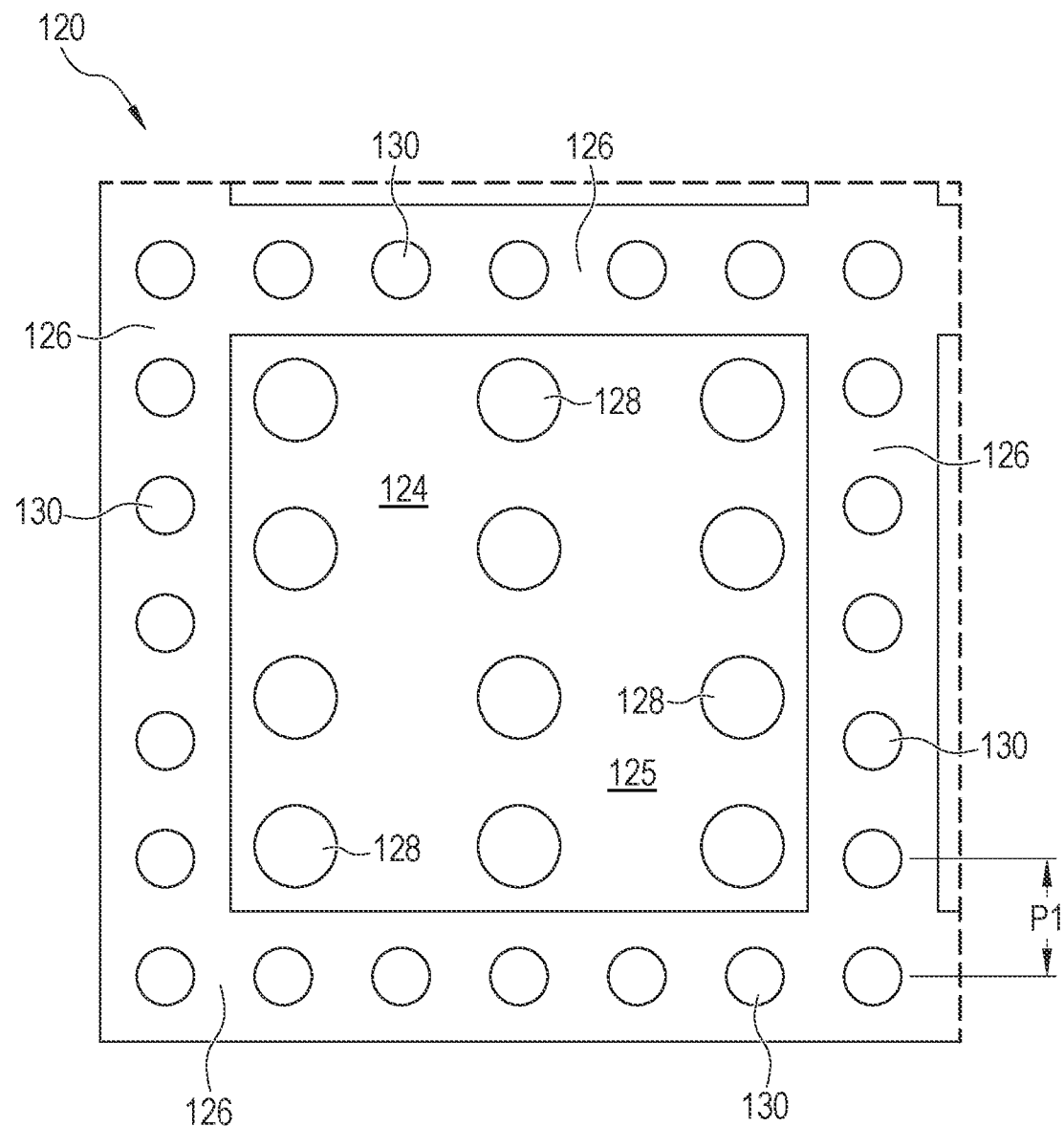
Figure 2D:
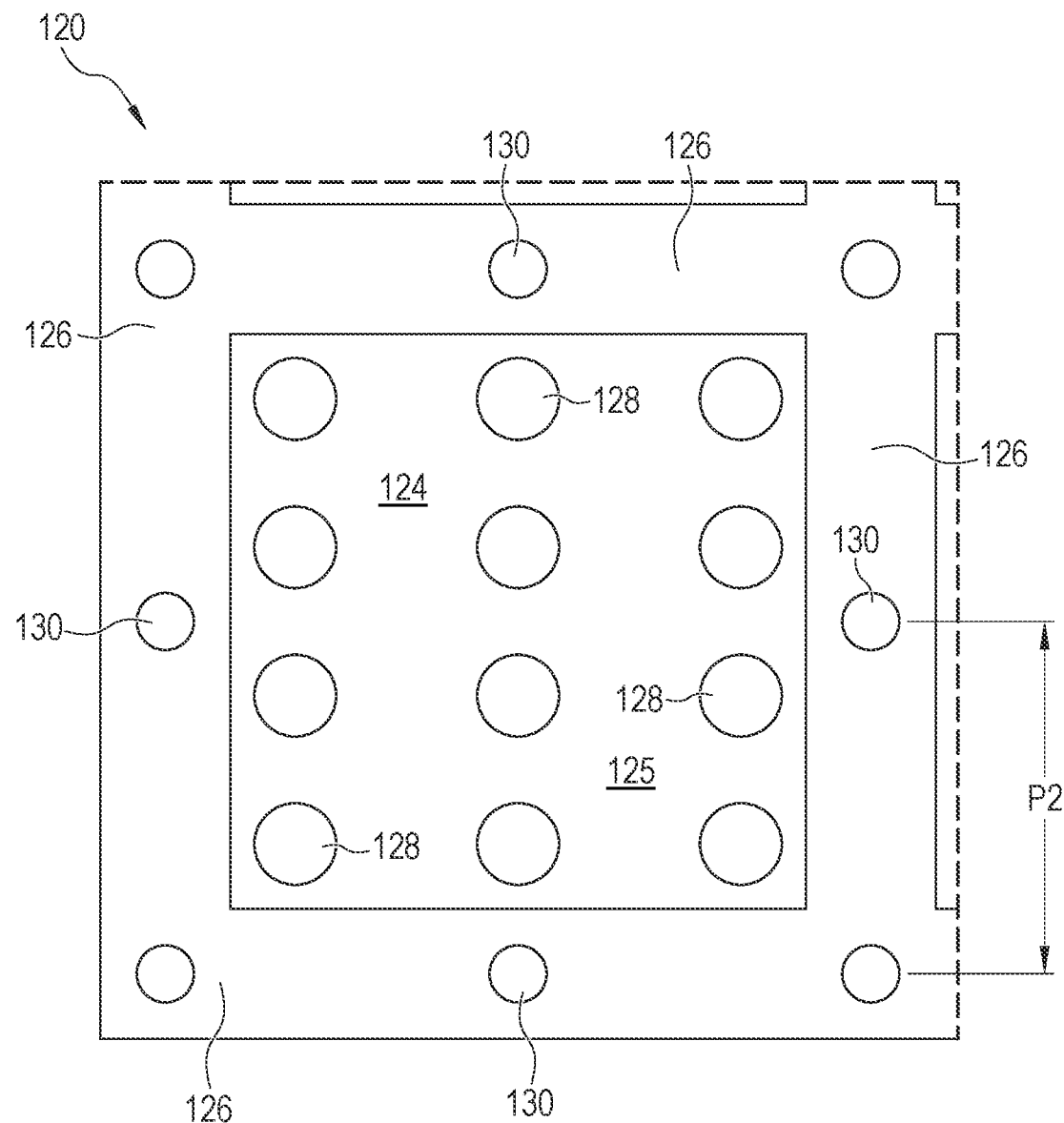
Figure 2E:
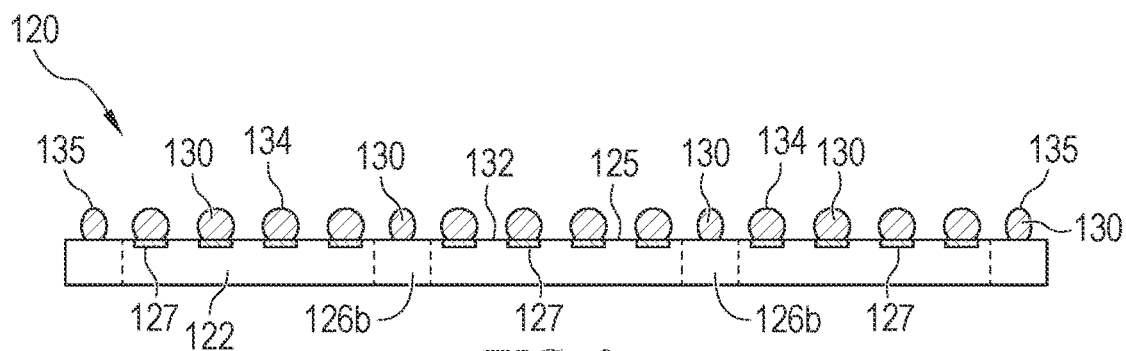

An electrically conductive layer 127 is formed over active surface 125 using PVD, CVD, electrolytic plating, electroless plating process, or other suitable metal deposition process, as in FIG. 2e. Conductive layer 127 can be one or more layers of Al, Cu, Sn, Ni, Au, Ag, or other suitable electrically conductive material. Conductive layer 127 operates as contact pads electrically connected to the circuits on active surface 125 of semiconductor die 124.

An electrically conductive bump material is deposited over conductive layer 127 on active surface 125 of semiconductor wafer 120, within the active area of semiconductor die 124, using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 127 using a suitable attachment or bonding process. In one embodiment, the bump material is reflowed by heating the material above its melting point to form balls or bumps 128. In one embodiment, bump 128 is formed over a UBM having a wetting layer, barrier layer, and adhesive layer. Bump 128 can also be compression bonded or thermocompression bonded to conductive layer 127. Bump 128 represents one type of interconnect structure that can be formed over conductive layer 127 within active area 125 of semiconductor die 124. The interconnect structure can also use conductive paste, stud bump, micro bump, or other electrical interconnect.

As discussed for bumps 118, it is desirable to provide maximum or at least sufficient adhesion between bumps 128 and conductive layer 127. Toward that end, bumps 128 can be further flattened by a coining process. The coining induces plastic flow on the surface of bump 128 in order to create a flat top surface. The plastic flow also reduces surface grain size, and the work hardens the material, while the deeper material retains properties of toughness and ductility.

The coining process introduces considerable pressure and stress bumps 128 of semiconductor wafer 120. For smaller semiconductor die 124, e.g., 4.0 mm by 4.0 mm, containing say, nineteen bumps per die, and 1049 die per wafer 120, that yields 19,931 bumps to absorb the coining pressure upon the wafer. In some manufacturing processes, the coining pressure is too great or becomes uneven for the 19,931 supporting bumps, leading to bump dissimilarities and lack of control of bump diameter, height, and coplanarity. Semiconductor wafer 120 may need 23,000 bumps or more to properly handle the coining pressure. Forming additional on active surface 125 of semiconductor die 124, for the sole purpose of addressing coining pressure, is undesirable from a design and manufacturing perspective.

In FIG. 2b, an electrically conductive bump material is deposited over surface 132 of semiconductor wafer 120, in an area defined by saw street 126, using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to saw street 126 using a suitable attachment or bonding process. In one embodiment, the bump material is reflowed by heating the material above its melting point to form balls or bumps 130. Bump 130 can also be compression bonded or thermocompression bonded to saw street 126.

Bump 130 is a dummy support bump or SOP having no electrical interconnect function. Yet, the total number of functional bumps 128 and dummy support bumps 130 meets or exceeds the target of 23,000 bumps per wafer 120. Dummy support bump or SOP 130 works with functional bumps 128 to distribute the coining pressure across semiconductor wafer 120 and maintain control of bump 128 diameter, height, and coplanarity. Dummy bumps 130 being formed within saw street 126, provide additional points of support during the coining operation, without adding bumps to active surface 125 of semiconductor die 124. Dummy support bumps 130 can be formed within saw streets 126 completely around each semiconductor die 124, or partially along certain portions of saw streets 126, depending on the number of additional support bumps required for the coining operation.

FIG. 2c illustrates further detail of a portion of semiconductor wafer 120 showing one semiconductor die 124 with bumps 128 and dummy bumps 130 formed within saw street 126 around the semiconductor die, depending on the number of dummy bumps 130 needed to support the coining operation. In one embodiment, dummy support bumps 130 have a pitch P1 of 130.0-200.0 μm within saw street 126.

FIG. 2d illustrates further detail of a portion of semiconductor wafer 120 showing one semiconductor die 124 with bumps 128 and dummy bumps 130 formed along portions of saw street 126, depending on the number of dummy bumps 130 needed to support the coining operation. In one embodiment, dummy support bumps 130 have a pitch P2 greater than pitch P1 within saw street 126.

Figure 2F:
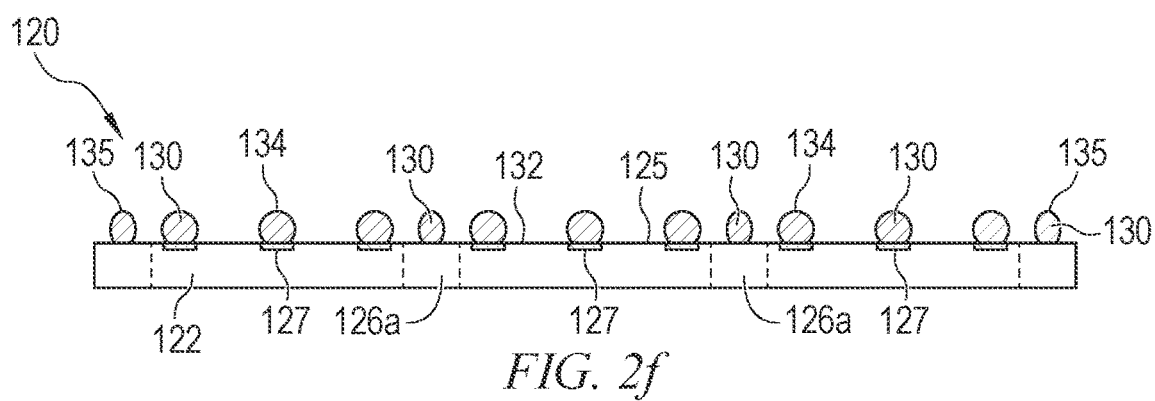

FIG. 2e is a first cross-sectional view of semiconductor wafer 120 showing semiconductor die 124 with bumps 128 and dummy bumps 130 formed within saw street 126b. FIG. 2f is a second cross-sectional view of semiconductor wafer 120, normal to the FIG. 2e view, showing semiconductor die 124 with bumps 128 and dummy bumps 130 formed within saw street 126a. In particular, top surface 134 of bumps 128 is coplanar with top surface 135 of bumps 130.

Figure 2G:
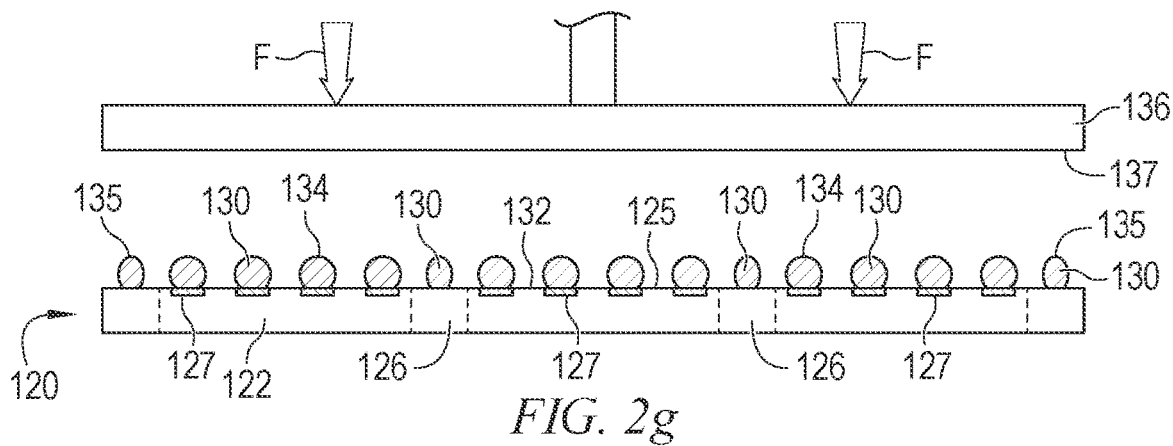
Figure 2H:
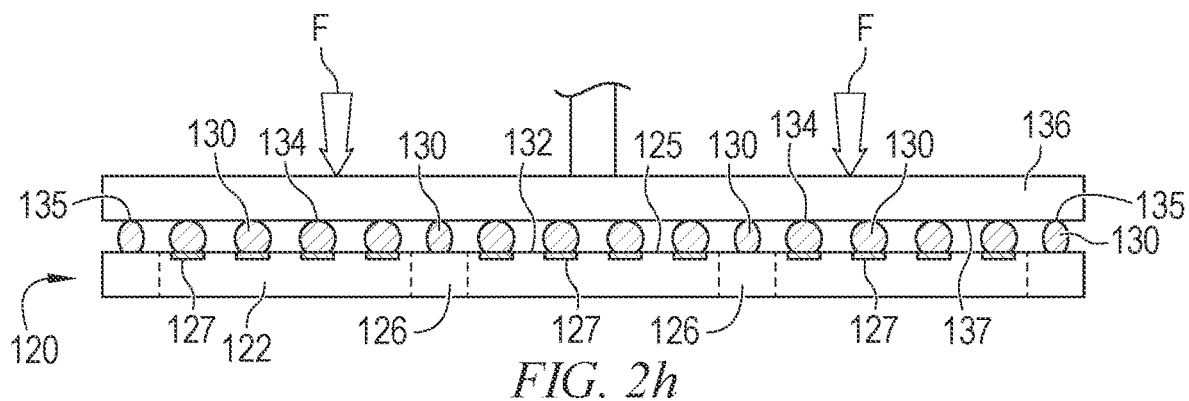

In FIGS. 2g-2h, semiconductor wafer 120 undergoes a coining operation with stamping press 136. Stamping press 136 asserts pressure under force F on functional bumps 128, as well as dummy bumps 130. In FIG. 2g, stamping press 136 is disposed above semiconductor wafer 120 with pressing surface 137 oriented toward bumps 128 and 130. FIG. 2h shows stamping press 136 contacting top surface 134 of functional bumps 128 and top surface 135 of dummy bumps 130, to subject semiconductor wafer 120 to a coining operation. Pressing surface 137 contacts coplanar top surface 134 of functional bumps 128 and top surface 135 of dummy support bumps 130 at the same time and distributes the force or pressure of the coining operation substantially equally across all bumps 128 and 130. With dummy bumps 130 in place within saw street 126, semiconductor wafer 120 has in excess of 23,000 bumps to distribute the pressure of the coining operation across semiconductor wafer 120, while maintaining control of bump 128 diameter, height, and coplanarity.

Figure 2I:
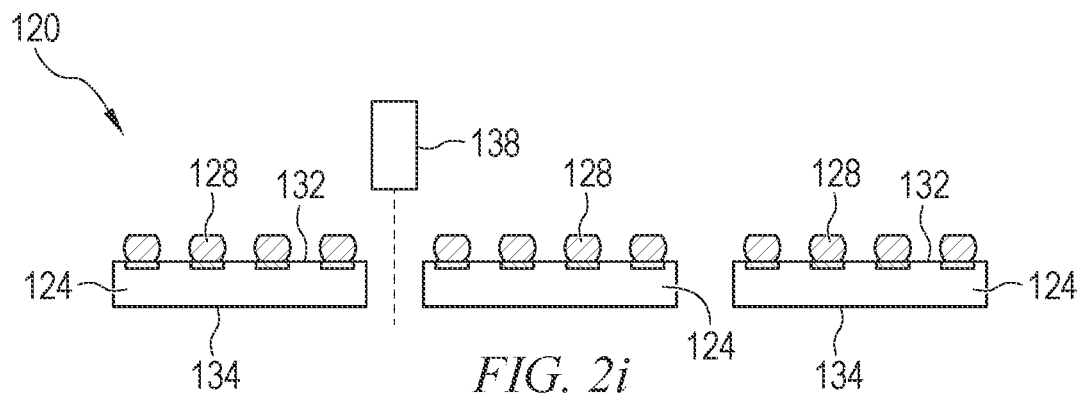
Figure 2J:
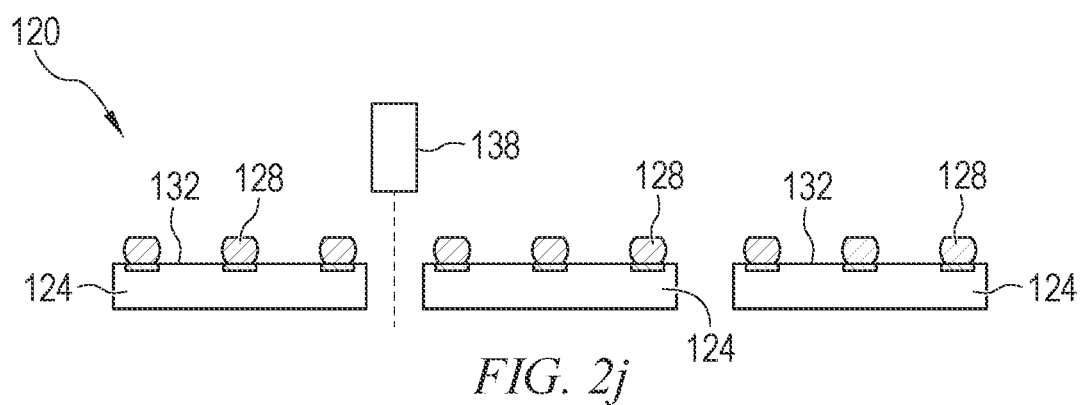

In FIG. 2i, semiconductor wafer 120 is singulated through saw street 126b and dummy bumps 130, from the viewpoint of FIG. 2e, using a saw blade or laser cutting tool 138 into individual semiconductor die 124. FIG. 2j shows the singulation of semiconductor wafer 120 through saw street 126a and dummy bumps 130, from the viewpoint of FIG. 2f. The singulation destroys or removes dummy bumps 130 within saw street 126, after the coining operation in FIGS. 2g-2h, as the dummy bumps have served their purpose and are no longer needed.

Figure 3:
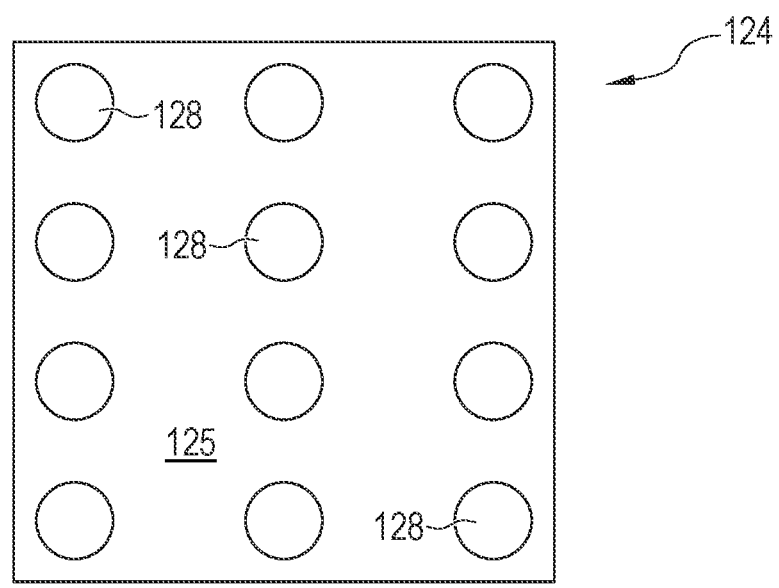
FIG. 3 illustrates the semiconductor die post coining operation and singulation.

FIG. 3 shows semiconductor die 124 post singulation. The individual semiconductor die 124 can be inspected and electrically tested for identification of known good die or known good unit (KGD/KGU). Bumps 128 have a flat top surface 134 from the coining process. Dummy support bump or SOP 130 in saw street 126 have worked with functional bumps 128 to distribute the coining pressure across semiconductor wafer 120 and maintain control of bump 128 diameter, height, and coplanarity. Dummy bumps 130 being formed within saw street 126, provide additional points of support during the coining operation, without adding bumps to active surface 125 of semiconductor die 124.

Figure 4A:
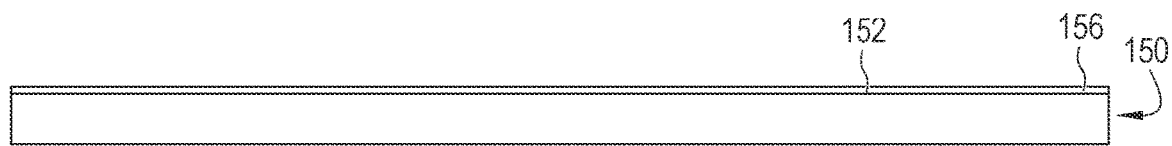
FIGS. 4a-4i illustrate a process of forming dummy bumps within saw streets of a substrate containing electrical components to distribute coining pressure.

In another embodiment, FIG. 4a shows a temporary substrate or carrier 150 containing sacrificial material, such as silicon, polymer, beryllium oxide, glass, or other suitable low-cost, rigid material for structural support. Substrate 150 has major surface 152 and major surface 154, opposite surface 152. In one embodiment, carrier 150 is a support structure with a temporary bonding layer 156 formed over the carrier. Temporary bonding layer 156 can be a film or foil bonded to surface 152.

Figure 4B:
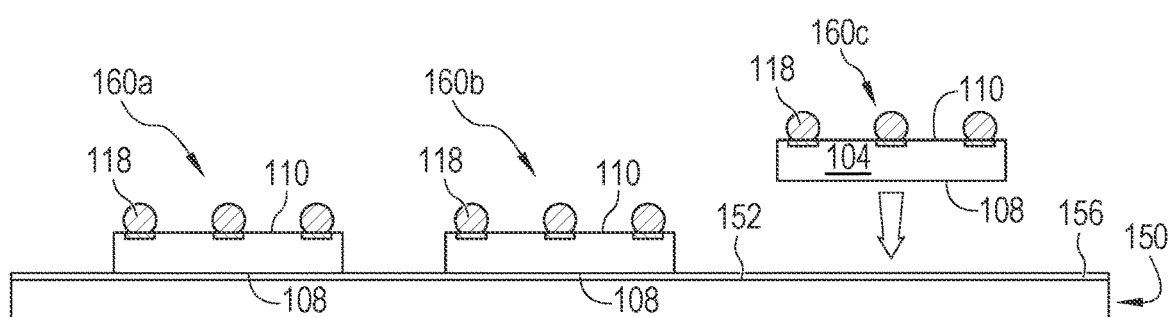

In FIG. 4b, electrical components 160a-160c are disposed over surface 152 of substrate 150. Electrical components 160a-160c can be similar to, or made similar to, semiconductor die 104 from FIG. 1c with back surface 108 oriented toward surface 152 of substrate 150. Alternatively, electrical components 160a-160c can include other semiconductor die, semiconductor packages, surface mount devices, RF components, discrete electrical devices, or integrated passive devices (IPD).

Figure 4C:
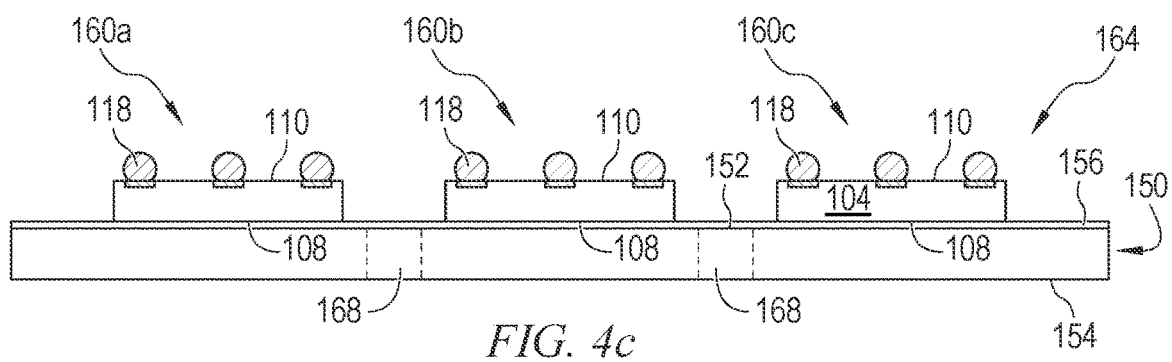

Electrical components 160a-160c are positioned over substrate 150 using a pick and place operation. Electrical components 160a-160c are brought into contact with bonding layer 156. FIG. 4c illustrates electrical components 160a-160c bonded to substrate 150, as reconstituted wafer 164. Electrical components 160a-160c are separated by saw street or line 168. Saw street 168a extends in a first direction across substrate 150, and saw street 168b extends in a second direction across substrate 150 different from saw street 168a, as in FIG. 4e.

As discussed for bumps 128, it is desirable to provide maximum or at least sufficient adhesion between bumps 118 and conductive layer 112. Toward that end, bumps 118 can be further flattened by a coining process. The coining induces plastic flow on the surface of bump 118 in order to create a flat top surface. The plastic flow also reduces surface grain size, and the work hardens the material, while the deeper material retains properties of toughness and ductility.

The coining process introduces considerable pressure and stress bumps 118 over reconstituted wafer 164. For smaller semiconductor die 104, e.g., 4.0 mm by 4.0 mm, containing say, nineteen bumps per die, and 1049 die per reconstituted wafer 164, that yields 19,931 bumps to absorb the coining pressure upon the wafer. In some manufacturing processes, the coining pressure is too great or becomes uneven for the 19,931 supporting bumps, leading to bump dissimilarities and lack of control of bump diameter, height, and coplanarity. Reconstituted wafer 164 should have 23,000 bumps or more to properly handle the coining pressure. Forming additional bumps on active surface 110 of semiconductor die 104, for the sole purpose of addressing coining pressure, is undesirable from a design and manufacturing perspective.

Figure 4D:
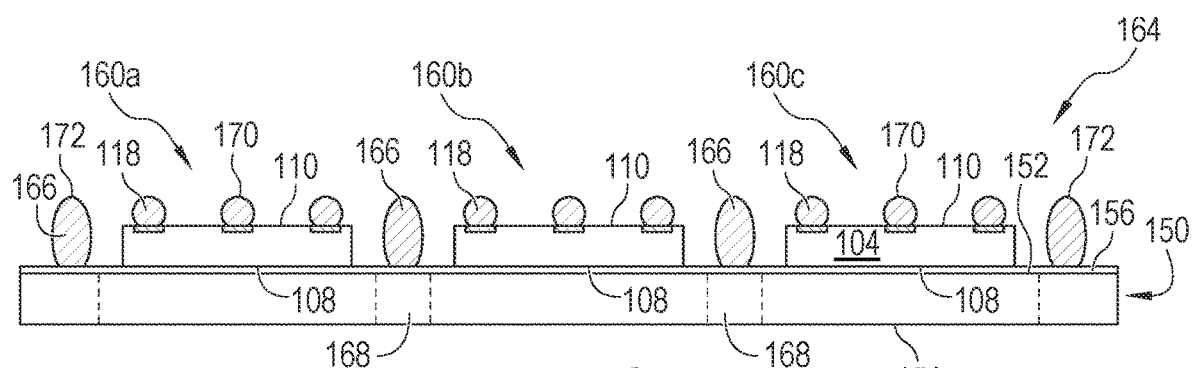

In FIG. 4d, an electrically conductive bump material is deposited over surface 152 of substrate 150, in an area defined by saw street 168, using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to saw street 168 using a suitable attachment or bonding process. In one embodiment, the bump material is reflowed by heating the material above its melting point to form balls or bumps 166. Bump 166 can also be compression bonded or thermocompression bonded to saw street 168.

Bump 166 is a dummy support bump or SOP having no electrical interconnect function. Yet, the total number of functional bumps 118 and dummy support bumps 166 exceeds the target of 23,000 bumps per reconstituted wafer 164. Dummy support bump or SOP 166 works with functional bumps 118 to distribute the coining pressure across reconstituted wafer 164 and maintain control of bump 118 diameter, height, and coplanarity. Dummy bumps 166 being formed within saw street 168, provide additional points of support during the coining operation, without adding bumps to the active surface of electrical component 160a-160c. Dummy support bumps 166 can be formed within saw streets 168 completely around each electrical component 160a-160b, or partially along certain portions of saw streets 168, similar to FIGS. 2c-2d, depending on the number of additional support bumps required for the coining operation. In particular, top surface 170 of bumps 118 is coplanar with top surface 172 of bumps 166.

Figure 4E:
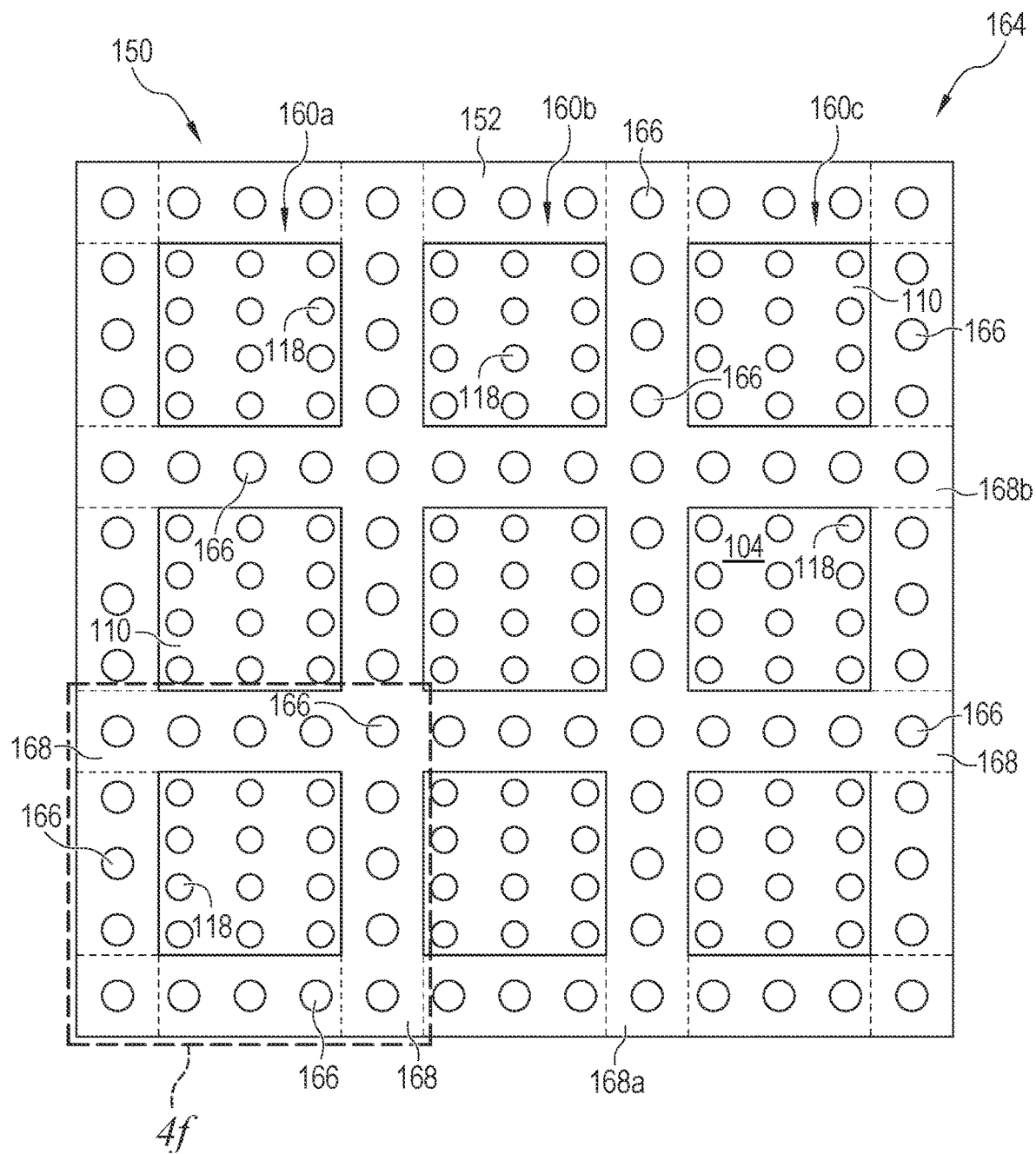
Figure 4F:
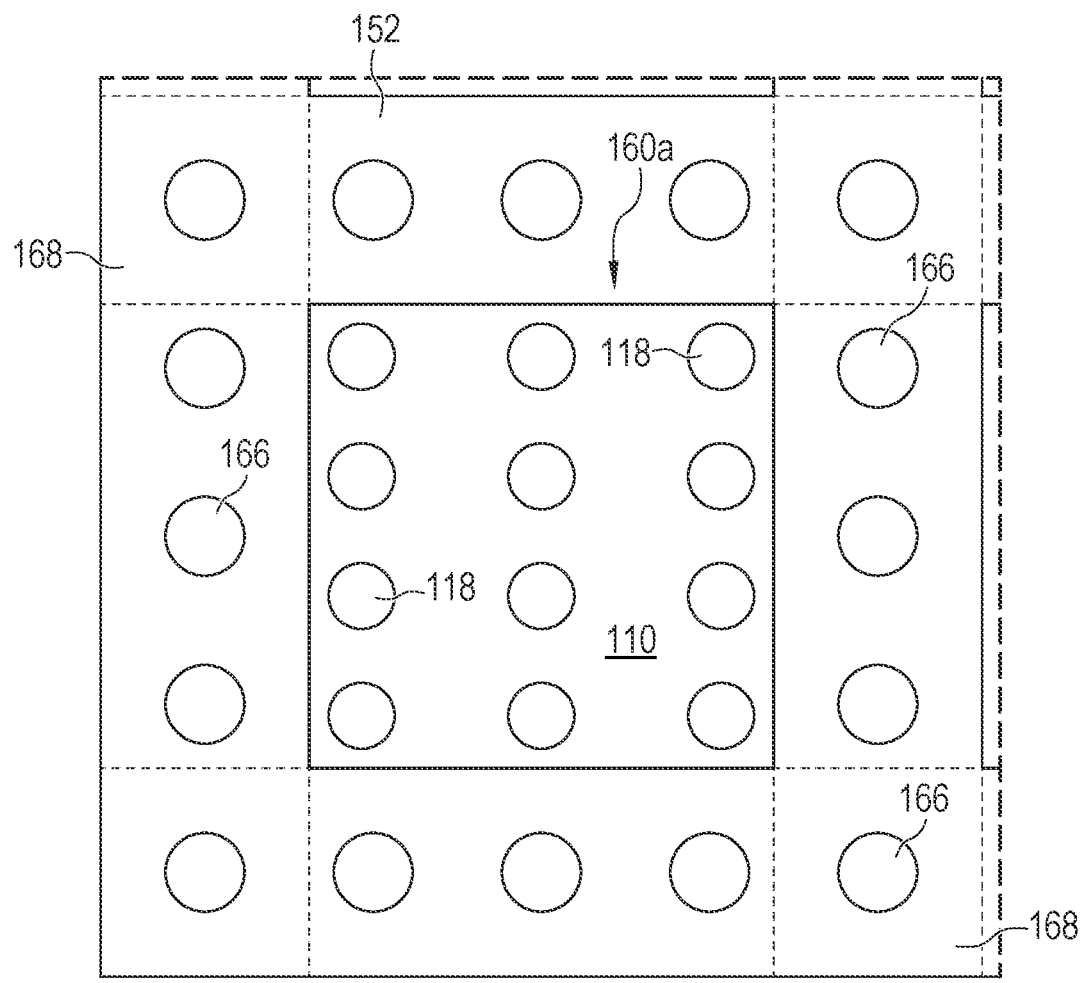

FIG. 4e is a top view of electrical components 160a-160c with bumps 118 bonded to reconstituted wafer 164 and dummy bumps 166 formed within saw street 168. FIG. 4f illustrates further detail of a portion of reconstituted wafer 164 showing one electrical component 160a with bumps 118 and dummy bumps 166 formed within saw street 168 around the electrical component.

Figure 4G:
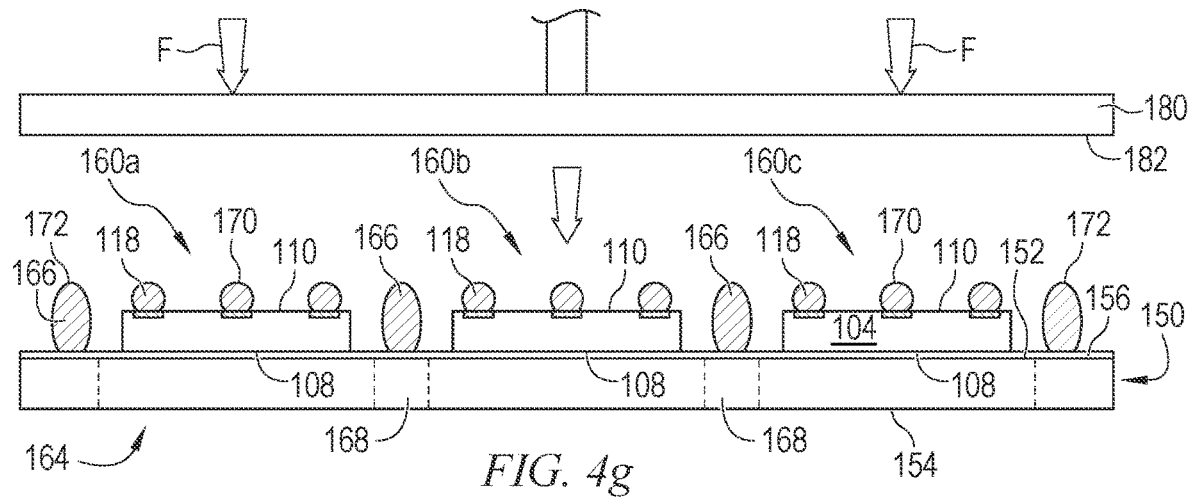
Figure 4H:
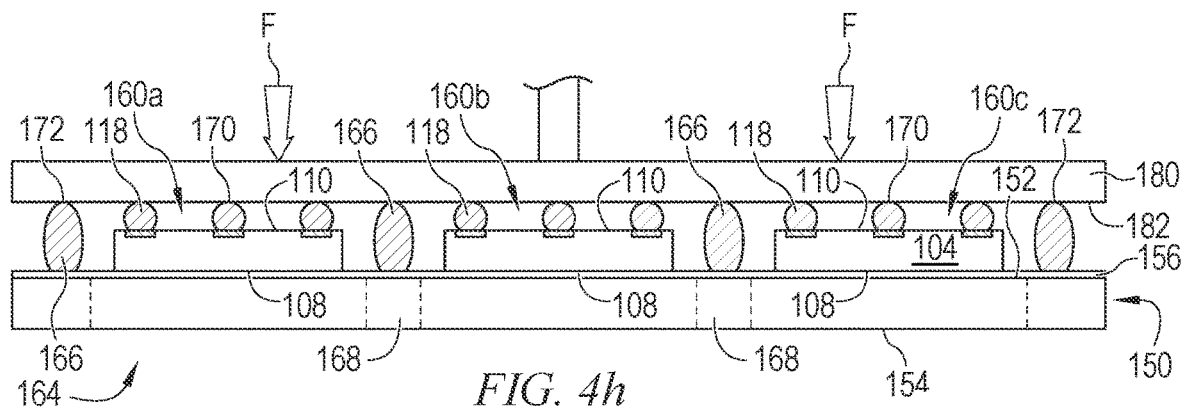

In FIGS. 4g-4h, reconstituted wafer 164 from FIGS. 4d-4f, undergoes a coining operation with stamping press 180. Stamping press 180 asserts pressure under force F on functional bumps 118, as well as dummy bumps 166. In FIG. 4g, stamping press 180 is disposed above reconstituted wafer 164 with pressing surface 182 oriented toward bumps 118 and 166. FIG. 4h shows stamping press 180 contacting top surface 170 of functional bumps 118 and top surface 172 of dummy bumps 166, to subject reconstituted wafer 164 to a coining operation. Pressing surface 182 contacts coplanar functional bumps 118 and dummy support bumps 166 at the same time to distribute the force or pressure of the coining operation substantially equally across all bumps 118 and 166. With dummy bumps 166 in place within saw street 168, reconstituted wafer 164 has in excess of 23,000 bumps to distribute the pressure of the coining operation across the substate, while maintaining control of bump 118 diameter, height, and coplanarity.

Figure 4I:
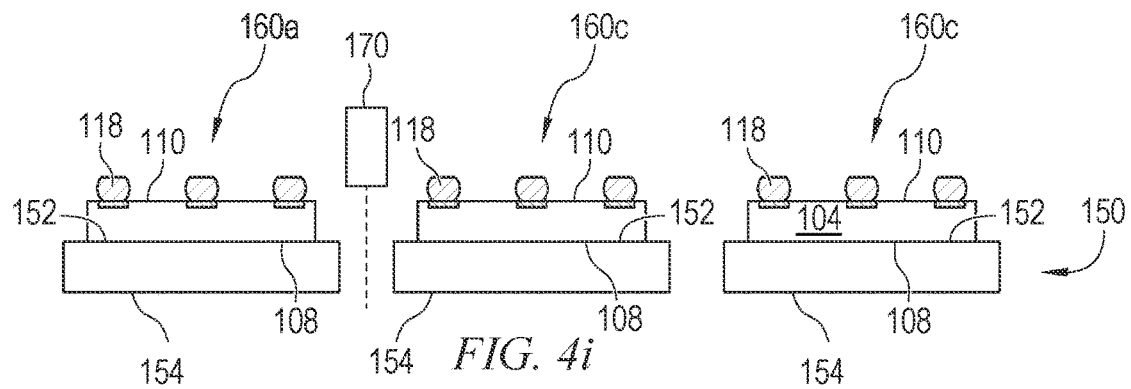

In FIG. 4i, reconstituted wafer 164 is singulated through saw street 168 and dummy bumps 166 using a saw blade or laser cutting tool 180 into individual electrical components 160a-160c. The singulation destroys or removes dummy bumps 166 within saw street 168, after the coining operation in FIGS. 4g-4h, as the dummy bumps have served their purpose and are no longer needed are no longer needed.

Figure 5:
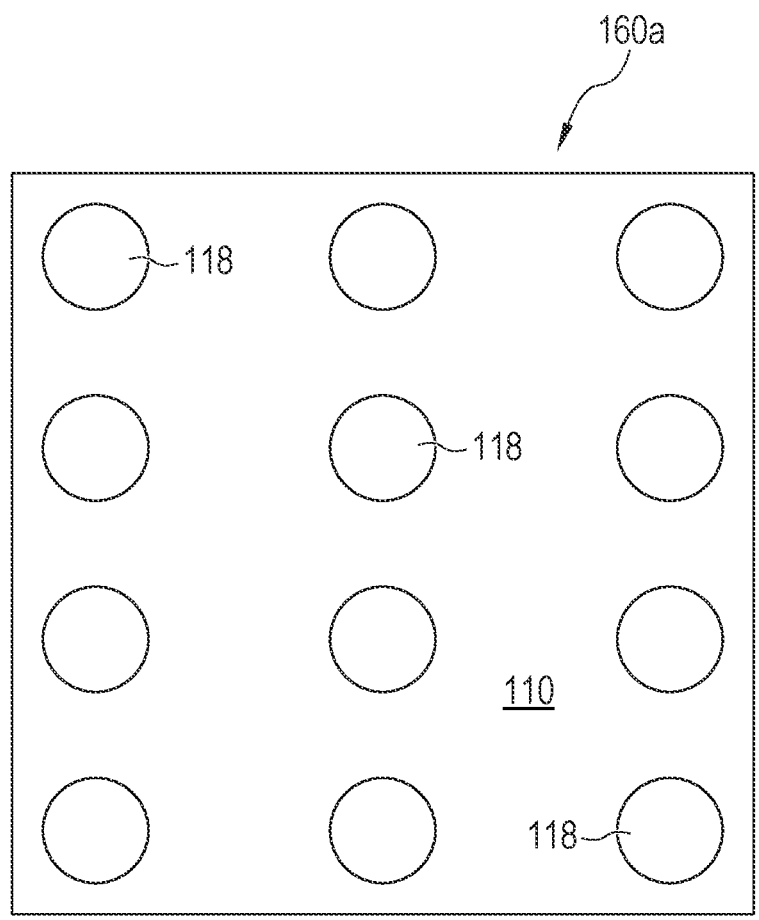
FIG. 5 illustrates the electrical component post coining operation and singulation.

FIG. 5 shows electrical component 160a post singulation. Substrate 150 and bonding layer 156 are removed by chemical etching, chemical mechanical polishing (CMP), mechanical peel-off, mechanical grinding, thermal bake, ultra-violet (UV) light, or wet stripping. The individual electrical component 160a can be inspected and electrically tested for identification of known good die or known good unit (KGD/KGU). Bumps 118 have a flat top surface 172 from the coining process. Dummy support bump or SOP 166 in saw street 168 have worked with functional bumps 118 to distribute the coining pressure across reconstituted wafer 164 and maintain control of bump 118 diameter, height, and coplanarity. Dummy bumps 166 being formed within saw street 168, provide additional points of support during the coining operation, without adding bumps to active surface 110 of semiconductor die 104.

Figure 6:
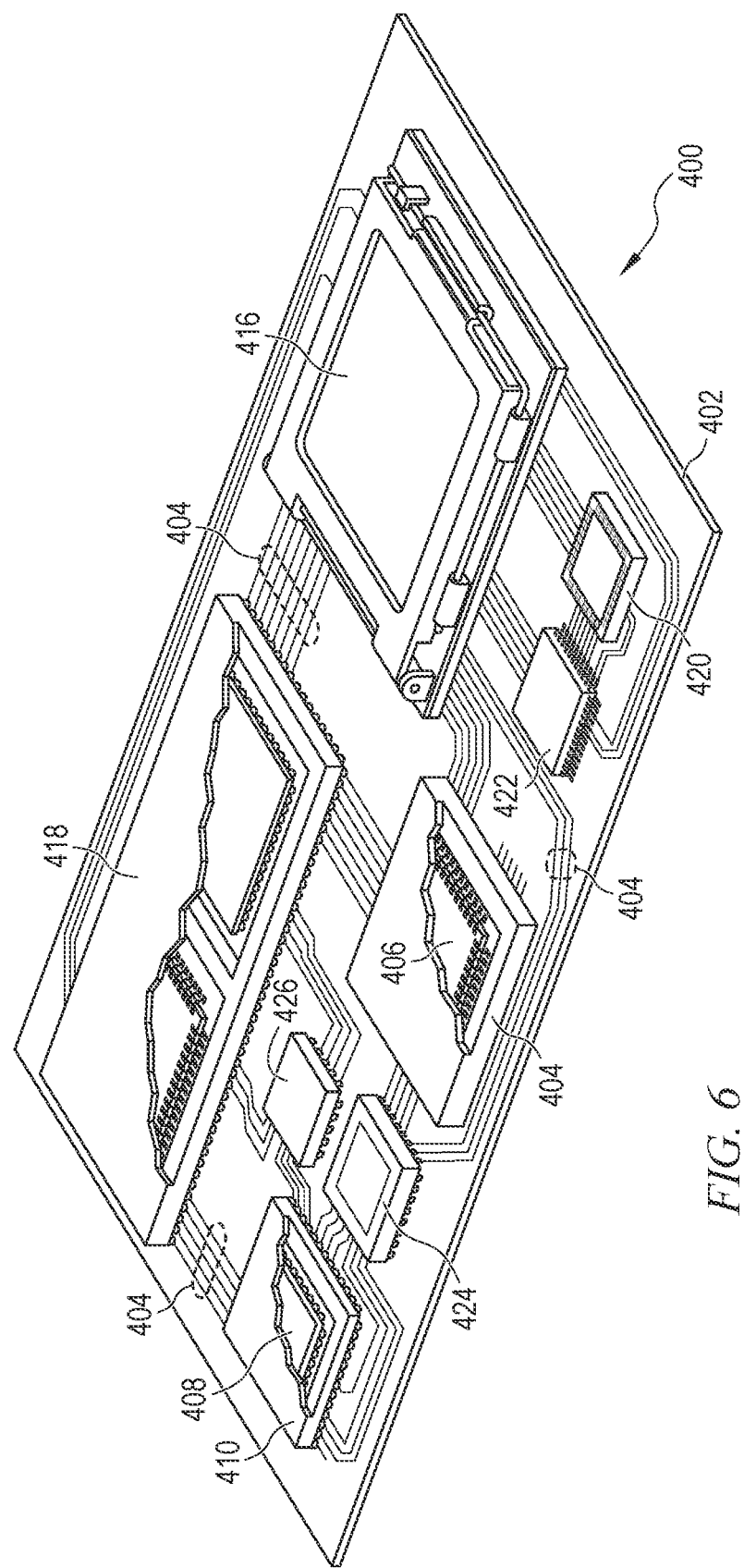
FIG. 6 illustrates a printed circuit board (PCB) with different types of packages disposed on a surface of the PCB.

FIG. 6 illustrates electrical device 400 having a chip carrier substrate or PCB 402 with a plurality of semiconductor packages disposed on a surface of PCB 402, including semiconductor die 124 and electrical components 160a-160c. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 6, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a semiconductor wafer or substrate including a plurality of semiconductor die;
   a plurality of first bumps formed over an active surface of the semiconductor wafer or substrate; and
   a plurality of second bumps formed within a saw street of the semiconductor wafer or substrate separating the plurality of semiconductor die.

2. The semiconductor device of claim 1, wherein a top surface of the first bumps is coplanar with a top surface of the second bumps.

3. The semiconductor device of claim 1, wherein the plurality of second bumps is formed within a first saw street of the semiconductor wafer or substrate.

4. The semiconductor device of claim 3, wherein the plurality of second bumps is formed within a second saw street of the semiconductor wafer or substrate different from the first saw street.

5. The semiconductor device of claim 1, wherein the first bumps are electrically connected to the semiconductor die to provide a function for the semiconductor die.

6. The semiconductor device of claim 1, wherein the second bumps are dummy bumps have no electrical function for the semiconductor die.

7. A semiconductor device, comprising:
   a semiconductor wafer or substrate;
   a plurality of first bumps formed over an active surface of the semiconductor wafer or substrate; and
   a plurality of second bumps formed within a saw street of the semiconductor wafer or substrate.

8. The semiconductor device of claim 7, wherein the semiconductor wafer or substrate includes a plurality of semiconductor die.

9. The semiconductor device of claim 8, wherein the first bumps are electrically connected to the semiconductor die to provide a function for the semiconductor die.

10. The semiconductor device of claim 8, wherein the second bumps are dummy bumps that have no electrical function for the semiconductor die.

11. The semiconductor device of claim 7, wherein a top surface of the first bumps is coplanar with a top surface of the second bumps.

12. The semiconductor device of claim 7, wherein the plurality of second bumps is formed within a first saw street of the semiconductor wafer or substrate.

13. The semiconductor device of claim 12, wherein the plurality of second bumps is formed within a second saw street of the semiconductor wafer or substrate different from the first saw street.

14. A method of making a semiconductor device, comprising:
   providing a semiconductor wafer or substrate including a plurality of semiconductor die;
   forming a plurality of first bumps over an active surface of the semiconductor wafer or substrate; and
   forming a plurality of second bumps within a saw street of the semiconductor wafer or substrate separating the plurality of semiconductor die.

15. The method of claim 14, wherein a top surface of the first bumps is coplanar with a top surface of the second bumps.

16. The method of claim 14, wherein the plurality of second bumps is formed within a first saw street of the semiconductor wafer or substrate.

17. The method of claim 16, wherein the plurality of second bumps is formed within a second saw street of the semiconductor wafer or substrate different from the first saw street.

18. The method of claim 14, wherein the first bumps are electrically connected to the semiconductor die to provide a function for the semiconductor die, and the second bumps are dummy bumps that have no electrical function for the semiconductor die.

19. The method of claim 14, further including singulating the semiconductor wafer or substrate through the saw street and second bumps.

20. A method of making a semiconductor device, comprising:
   providing a semiconductor wafer or substrate;
   forming a plurality of first bumps over an active surface of the semiconductor wafer or substrate; and
   forming a plurality of second bumps within a saw street of the semiconductor wafer or substrate.

21. The method of claim 20, wherein the semiconductor wafer or substrate includes a plurality of semiconductor die.

22. The method of claim 21, wherein the first bumps are electrically connected to the semiconductor die to provide a function for the semiconductor die, and the second bumps are dummy bumps that have no electrical function for the semiconductor die.

23. The method of claim 20, wherein a top surface of the first bumps is coplanar with a top surface of the second bumps.

24. The method of claim 20, wherein the plurality of second bumps is formed within a first saw street of the semiconductor wafer or substrate and further formed within a second saw street of the semiconductor wafer or substrate different from the first saw street.

25. The method of claim 20, further including singulating the semiconductor wafer or substrate through the saw street and second bumps.

* * * * *